(12) United States Patent
Faguet

(10) Patent No.: US 7,897,217 B2
(45) Date of Patent: Mar. 1, 2011

(54) METHOD AND SYSTEM FOR PERFORMING PLASMA ENHANCED ATOMIC LAYER DEPOSITION

(75) Inventor: Jacques Faguet, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 806 days.

(21) Appl. No.: 11/281,342

(22) Filed: Nov. 18, 2005

(65) Prior Publication Data

US 2007/0116887 A1    May 24, 2007

(51) Int. Cl.
  *H05H 1/24* (2006.01)
(52) U.S. Cl. ...................................................... 427/569
(58) Field of Classification Search .............. 427/248.1, 427/569
See application file for complete search history.

(56) References Cited

U.S. PATENT DOCUMENTS

| | | | | |
|---|---|---|---|---|
| 5,935,336 | A * | 8/1999 | Sandhu et al. | 118/723 IR |
| 6,350,317 | B1 * | 2/2002 | Hao et al. | 118/71 |
| 6,462,483 | B1 * | 10/2002 | Jeng et al. | 315/111.51 |
| 6,630,201 | B2 * | 10/2003 | Chiang et al. | 427/255.28 |
| 6,863,784 | B2 | 3/2005 | Hao et al. | |
| 2003/0031794 | A1 * | 2/2003 | Tada et al. | 427/255.391 |
| 2003/0143328 | A1 * | 7/2003 | Chen et al. | 427/255.28 |
| 2003/0209324 | A1 | 11/2003 | Fink | |

OTHER PUBLICATIONS

Office Action issued for the People's Republic of China (with English translation) dated Oct. 13, 2010, Patent Application No. 200680051358.0.

* cited by examiner

*Primary Examiner*—Timothy H Meeks
*Assistant Examiner*—Elizabeth Burkhart
(74) *Attorney, Agent, or Firm*—Oblon, Spivak, McClelland, Maier & Neustadt, L.L.P.

(57) ABSTRACT

A method, computer readable medium, and system for vapor deposition on a substrate that introduce a gaseous film precursor to a process space, increase the volume of the process space from a first size to a second size to form an enlarged process space, introduce a reduction gas to the enlarged process space, and form a reduction plasma from the reduction gas. The system for vapor deposition includes a process chamber including a first process space and further including a second process space that includes the first process space and that has a second volume that exceeds the first volume. The first process space is configured for atomic layer deposition, and the second process space is configured for plasma reduction of a layer deposited in the first process space.

22 Claims, 6 Drawing Sheets

METHOD AND SYSTEM FOR PERFORMING PLASMA ENHANCED ATOMIC LAYER DEPOSITION

CROSS REFERENCE TO RELATED APPLICATIONS

This application is related to U.S. Ser. No. 11/090,255, entitled "A PLASMA ENHANCED ATOMIC LAYER DEPOSITION SYSTEM", now U.S. Pat. Appl. Pub. No.2006/0213437, the entire contents of which are incorporated herein by reference. This application is related to U.S. Ser. No. 11/084,176, entitled "A DEPOSITION SYSTEM AND METHOD", now U.S. Pat. Appl. Pub. No. 2006/0211243, the entire contents of which are incorporated herein by reference. This application is related to U.S. Ser. No. 11/090,939, entitled "A PLASMA ENHANCED ATOMIC LAYER DEPOSITION SYSTEM HAVING REDUCED CONTAMINATION", now U.S. Pat. Appl. Pub. No. 2006/0213439, the entire contents of which are incorporated herein by reference. This application is related to U.S. Ser. No. 11/281,343, entitled "METHOD AND SYSTEM FOR PERFORMING DIFFERENT DEPOSITION PROCESSES WITHIN A SINGLE CHAMBER", now U.S. Pat. Appl. Pub. No. 2007/0116888, the entire contents of which are incorporated herein by reference.

BACKGROUND OF THE INVENTION

1. Field of Invention

The present invention relates to a deposition system and a method of operating thereof, and more particularly to a deposition system for atomic layer deposition.

2. Description of Related Art

Typically, during materials processing, when fabricating composite material structures, plasma is employed to facilitate the addition and removal of material films. For example, in semiconductor processing, a dry plasma etch process is often utilized to remove or etch material along fine lines or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by a thermal CVD process that thermally heats the process gas (without plasma excitation) to temperatures near or above the dissociation temperature of the process gas. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD) and plasma enhanced ALD (PEALD) have emerged as candidates for ultra-thin gate film formation in front end-of-line (FEOL) operations, as well as ultra-thin barrier layer and seed layer formation for metallization in back end-of-line (BEOL) operations. In ALD, two or more process gases, such as a film precursor and a reduction gas, are introduced alternatingly and sequentially while the substrate is heated in order to form a material film one monolayer at a time. In PEALD, plasma is formed during the introduction of the reduction gas to form a reduction plasma. To date, ALD and PEALD processes have proven to provide improved uniformity in layer thickness and conformality to features on which the layer is deposited, albeit these processes are slower than their CVD and PECVD counterparts.

SUMMARY OF THE INVENTION

One object of the present invention is directed to addressing various problems with semiconductor processing at ever decreasing line sizes where conformality, adhesion, and purity are becoming increasingly important issues affecting the resultant semiconductor device.

Another object of the present invention is to reduce contamination problems between interfaces of subsequently deposited material layers.

Another object of the present invention is to provide a configuration compatible for atomic layer deposition and plasma enhanced reduction within the same system.

Variations of these and/or other objects of the present invention are provided by certain embodiments of the present invention.

In one embodiment of the present invention, a method is provided for processing a substrate, including disposing a substrate in a vapor deposition system having a process space defined above the substrate, introducing a gaseous film precursor to the process space, increasing the volume of the process space from a first size to a second size to form an enlarged process space, introducing a reduction gas to the enlarged process space, and forming a reduction plasma from the reduction gas.

In another embodiment of the present invention, a system for thin film vapor deposition on a substrate is provided that includes a process chamber with a first process space having a first volume. The process chamber further includes a second process space that includes the first process space and that has a second volume that exceeds the first volume. The first process space is configured for adsorbing a film precursor, and the second process space is configured for plasma reduction of the film precursor adsorbed in the first process space.

BRIEF DESCRIPTION OF THE DRAWINGS

In the accompanying drawings, a more complete appreciation of the present invention and many attendant advantages thereof will be readily obtained as the same becomes better understood by reference to the following detailed description when considered in connection with the accompanying drawings, wherein.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
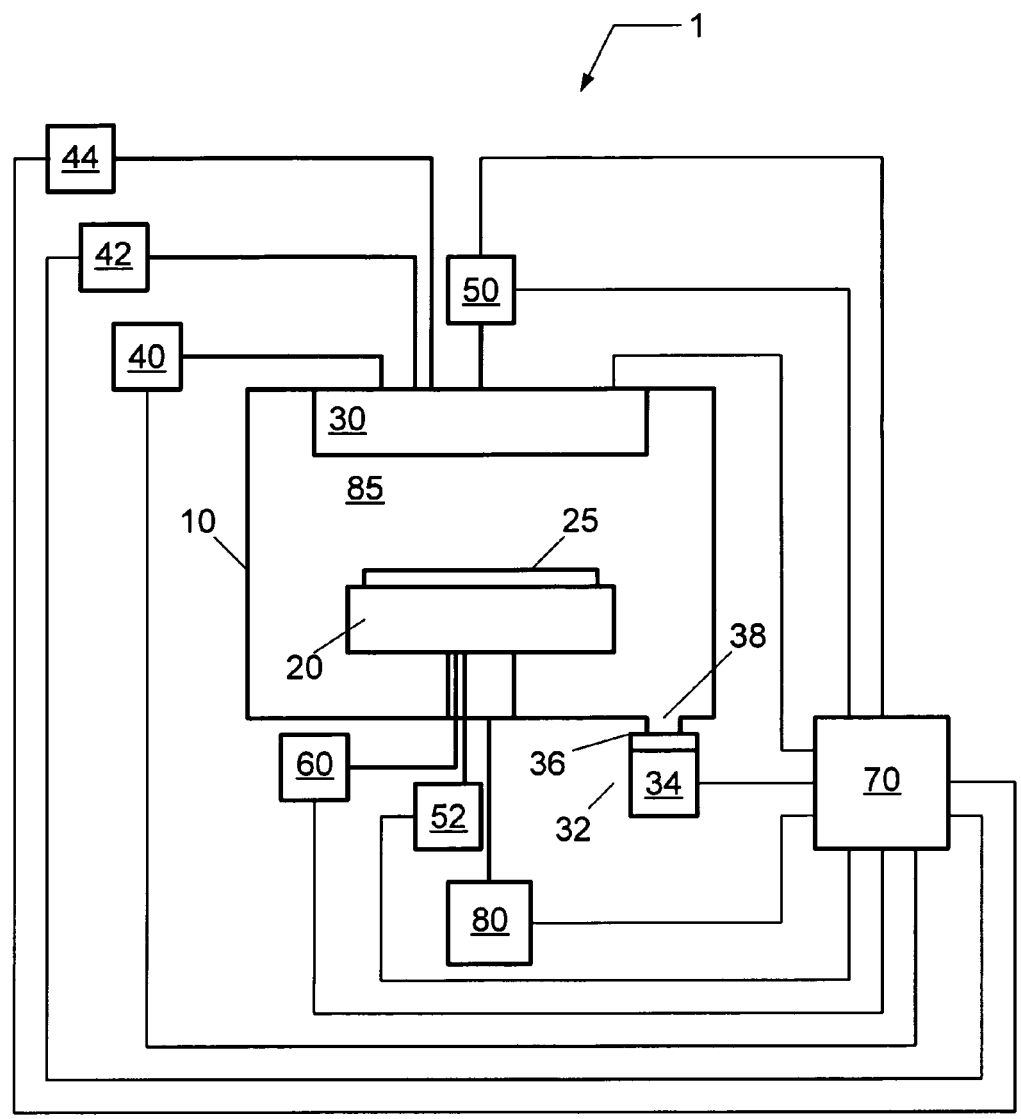
FIG. 1 depicts a schematic view of a deposition system in accordance with one embodiment of the present invention.

Referring now to the drawings, wherein like reference numerals designate identical or corresponding parts throughout the several views, FIG. 1 illustrates a deposition system 1 for depositing a thin film, such as for example a barrier film, on a substrate using for example a plasma enhanced atomic layer deposition (PEALD) process. During the metallization of inter-connect and intra-connect structures for semiconductor devices in back-end-of-line (BEOL) operations, a thin conformal barrier layer may be deposited on wiring trenches or vias to minimize the migration of metal into the inter-level or intra-level dielectric, a thin conformal seed layer may be deposited on wiring trenches or vias to provide a film with acceptable adhesion properties for bulk metal fill, and/or a thin conformal adhesion layer may be deposited on wiring trenches or vias to provide a film with acceptable adhesion properties for metal seed deposition. In addition to these processes, a bulk metal such as copper must be deposited within the wiring trench or via.

These processes in the past typically could require separate chambers customized to the particular needs of each of these processes as no single chamber could accommodate all of the process requirements. For example, a thin film barrier layer is preferably performed at a self-limited ALD process to provide acceptable conformality. Because ALD requires alternating different process gases, deposition occurs at a relatively slow deposition rate. The present inventors have recognized that performing a thermal ALD process in a small process space volume allows rapid gas injection and an evacuation of the alternating gases, which shortens the ALD cycle. However, when performing plasma enhanced ALD, plasma uniformity suffers in a small process space volume due to the close spacing between the substrate and the upper assembly. The present inventors have recognized that the non-plasma step in a PEALD process can benefit from a small process space volume to increase throughput and/or preserve process gas while a larger process space volume is required to sustain a uniform plasma during the plasma assisted reduction step in the PEALD process.

In FIG. 1, deposition system 1 according to one embodiment of the present invention includes a processing chamber 10 having a substrate stage 20 configured to support a substrate 25, upon which a thin film is to be formed. Additionally, the deposition system 1 as illustrated in FIG. 1 includes a process volume adjustment system 80 coupled to the processing chamber 10 and the substrate stage 20, and configured to adjust the volume of the process space adjacent substrate 25. For example, the process volume adjustment system 80 can be configured to vertically translate the substrate stage 20 between a first position creating a first process space 85 with a first volume (see FIG. 1) and a second position creating a second process space 85' with a second volume (see FIG. 2).

Figure 2:
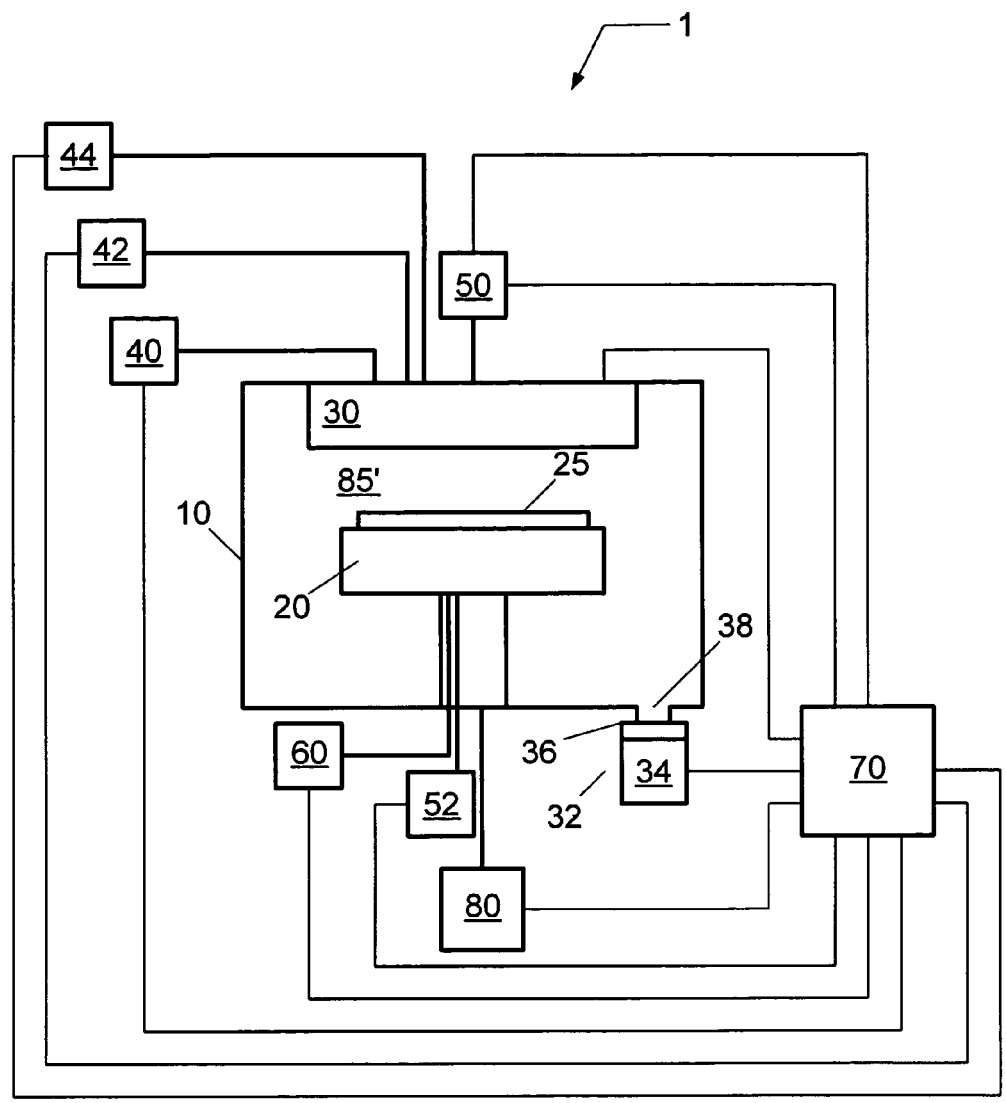
FIG. 2 depicts a schematic view of the deposition system of FIG. 1 showing an enlarged process space in accordance with one embodiment of the present invention.

As illustrated in FIGS. 1 and 2, deposition system 1 can include a substrate temperature control system 60 coupled to the substrate stage 20 and configured to elevate and control the temperature of substrate 25. Substrate temperature control system 60 can include temperature control elements, such as a cooling system including a re-circulating coolant flow that receives heat from substrate stage 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers can be included in the substrate stage 20, as well as the chamber wall of the processing chamber 10 and any other component within the deposition system 1.

In order to improve the thermal transfer between substrate 25 and substrate stage 20, substrate stage 20 can include a mechanical clamping system, or an electrical clamping system, such as an electrostatic clamping system, to affix substrate 25 to an upper surface of substrate stage 20. Furthermore, substrate stage 20 can further include a substrate backside gas delivery system configured to introduce gas to the backside of substrate 25 in order to improve the gas-gap thermal conductance between substrate 25 and substrate stage 20. Such a system can be utilized when temperature control of the substrate is required at elevated or reduced temperatures. For example, the substrate backside gas system can include a two-zone gas distribution system, wherein the helium gas gap pressure can be independently varied between the center and the edge of substrate 25.

The substrate stage 20 along with in vacuo mechanisms to translate the substrate stage and interior mechanisms for substrate temperature control system 60 can constitute a lower chamber assembly of the processing chamber 10.

The processing chamber 10 can further include an upper chamber assembly 30 coupled to a first process material gas supply system 40, a second process material gas supply system 42, and a purge gas supply system 44. As such, the upper chamber assembly 30, through the first process material gas supply system 40 and the second process material gas supply system 42, can provide respectively a gaseous film precursor and a reduction gas to process spaces 85 and 85'. A showerhead design, as known in the art, can be used to uniformly distribute the first and second process gas materials into the process space 85. Exemplary showerheads are described in greater detail in pending U.S. Patent Application Pub. No. 20040123803, the entire contents of which is incorporated herein by reference in its entirety, and in previously incorporated by reference U.S. Ser. No. 11/090,255.

The deposition system 1 may be configured to process 200 mm substrates, 300 mm substrates, or larger-sized substrates. In fact, it is contemplated that the deposition systems described in the present invention may be configured to process substrates, wafers, or LCDs regardless of their size, as would be appreciated by those skilled in the art. Substrates can be introduced to processing chamber 10, and the substrate may be lifted to and from an upper surface of substrate stage 20 via a substrate lift system (not shown).

According to one embodiment of the present invention, the first process material gas supply system 40 and the second process material gas supply system 42 can be configured to alternatingly introduce the gaseous film precursor (i.e., a first process gas material) to processing chamber 10 and the reduction gas (i.e., a second process gas material) to processing chamber 10. The alternation of the introduction of the first process gas material and the introduction of the second process gas material can be cyclical, or it may be acyclical with variable time periods between introduction of the first and second process gas materials. The first process gas material as the gaseous film precursor can have a composition having the principal atomic or molecular species found in the film formed on substrate 25. The film precursor can originate as a solid phase, a liquid phase, or a gaseous phase, and may be delivered to processing chamber 10 in a gaseous phase. The second process gas material can, for example, include a reduction gas. The reduction gas can originate as a solid phase, a liquid phase, or a gaseous phase, and may be delivered to processing chamber 10 in a gaseous phase. Examples of gaseous film precursors and reduction gases are given below.

The first material supply system 140, the second material supply system 142, and the purge gas supply system 144 can include one or more material sources, one or more pressure control devices, one or more flow control devices, one or more filters, one or more valves, or one or more flow sensors. The flow control devices can include pneumatic driven valves, electromechanical (solenoidal) valves, and/or high-rate pulsed gas injection valves. An exemplary pulsed gas injection system is described in greater detail in pending U.S. Patent Application Publi. No. 20040123803, the entire contents of which are incorporated herein by reference.

Referring still to FIG. 1, the deposition system 1 in one embodiment of the present invention can include a plasma generation system configured to generate a plasma during at least a portion of the alternating introduction of the first process gas material and the second process gas material to processing chamber 10. The plasma generation system can include a first power source 50 coupled to the processing chamber 10, and configured to couple power to the first process gas material, or the second process gas material, or both. The first power source 50 may include a radio frequency (RF) generator and an impedance match network (not shown), and may further include an electrode (not shown) through which RF power is coupled to plasma in processing chamber 10. The electrode can be formed in the upper assembly 30, and it can be configured to oppose the substrate stage 20.

The impedance match network can be configured to optimize the transfer of RF power from the RF generator to the plasma by matching the output impedance of the match network with the input impedance of the processing chamber, including the electrode, and plasma. For instance, the impedance match network serves to improve the transfer of RF power to plasma in plasma processing chamber 10 by reducing the reflected power. Match network topologies (e.g. L-type, π-type, T-type, etc.) and automatic control methods are well known to those skilled in the art. A typical frequency for the RF power can range from about 0.1 MHz to about 100 MHz. Alternatively, the RF frequency can, for example, range from approximately 400 kHz to approximately 60 MHz, By way of further example, the RF frequency can, for example, be approximately 13.56 or 27.12 MHz.

The deposition system 1 in one embodiment of the present invention can include a substrate bias generation system configured to generate a plasma during at least a portion of the alternating and cyclical introduction of the first process gas material and the second process gas material to processing chamber 10. The substrate bias system can include a second power source 52 coupled to the processing chamber 10, and configured to couple power to substrate 25. The second power source 52 may include a radio frequency (RF) generator and an impedance match network, and may further include an electrode through which RF power is coupled to substrate 25. The electrode can be formed in substrate stage 20. For instance, substrate stage 20 can be electrically biased with a DC voltage or at an RF voltage via the transmission of RF power from an RF generator (not shown) through an impedance match network (not shown) to substrate stage 20. A typical frequency for the RF bias can range from about 0.1 MHz to about 100 MHz. RF bias systems for plasma processing are well known to those skilled in the art. Alternately, RF power can be applied to the substrate stage electrode at multiple frequencies. Alternatively, the RF frequency can, for example, range from approximately 400 kHz to approximately 60 MHz, By way of further example, the RF frequency can, for example, be approximately 13.56 or 27.12 MHz. The substrate bias generation system may operate at a different or the same frequency as the plasma generation system.

Although the plasma generation system and the substrate bias system are illustrated in FIG. 1 as separate entities, these systems may include one or more power sources coupled to substrate stage 20.

Furthermore, the processing chamber 10 is coupled to a pressure control system 32, including for example a vacuum pumping system 34 and a valve 36, through a duct 38. The pressure control system 34 is configured to controllably evacuate the processing chamber 10 to a pressure suitable for forming the thin film on substrate 25, and suitable for use of the first and second process materials.

The vacuum pumping system 34 can include a turbo-molecular vacuum pump (TMP) capable of a pumping speed up to about 5000 liters per second (and greater) and valve 36 can include a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 110. The pressure measuring device can be, for example, a Type 628B Baratron absolute capacitance manometer commercially available from MKS Instruments, Inc. (Andover, Mass.).

Figure 3:
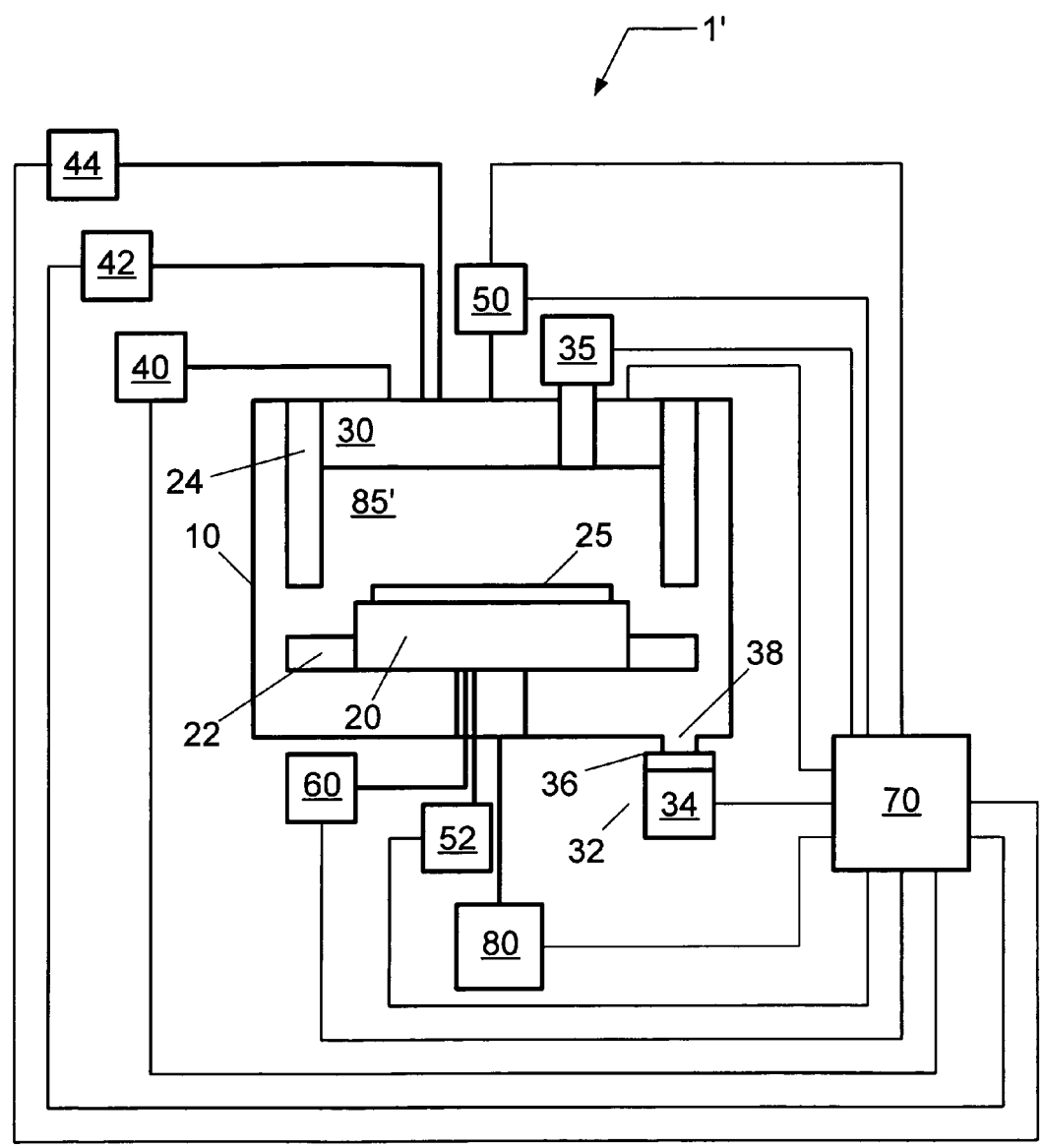
FIG. 3 depicts a schematic view of a deposition system in accordance with another embodiment of the invention.
Figure 4:
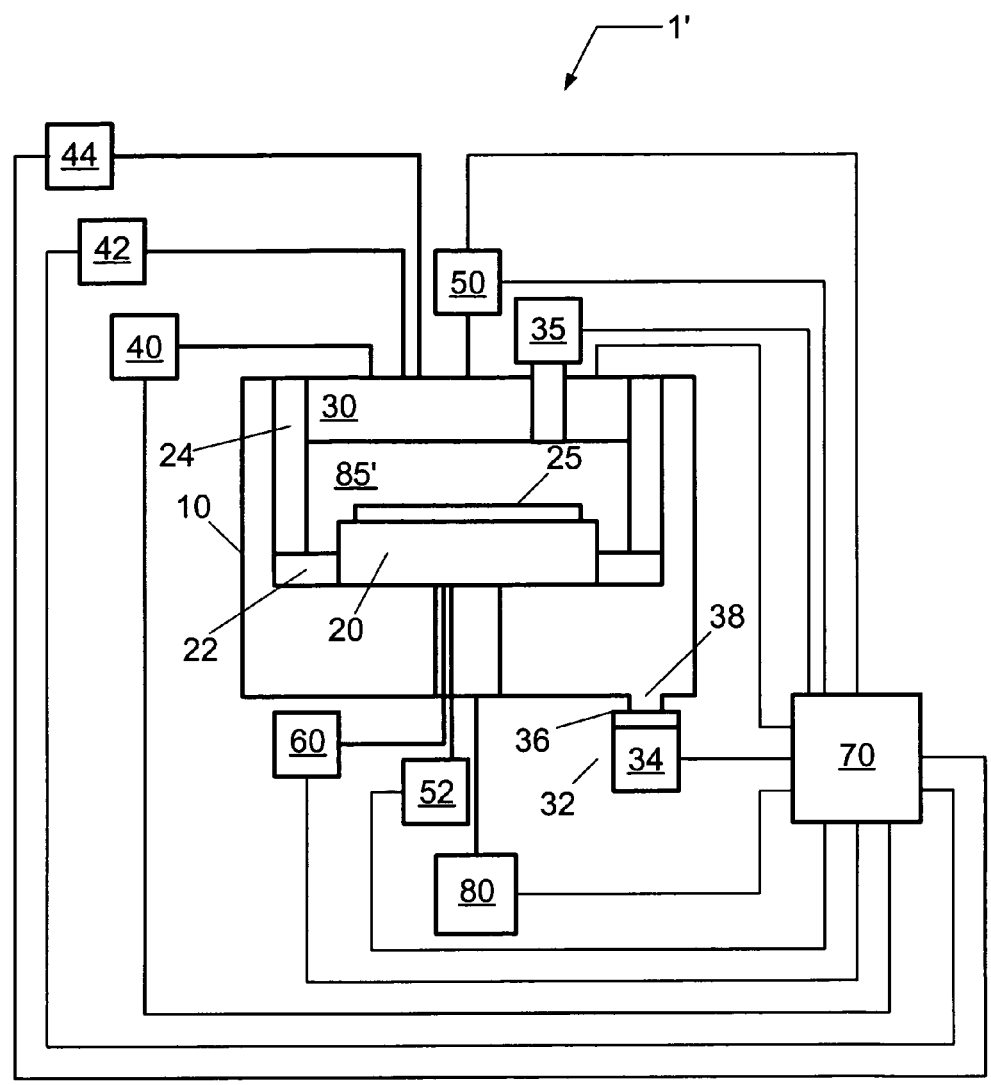
FIG. 4 depicts a schematic view of the deposition system of FIG. 3 showing an enlarged process space in accordance with one embodiment of the present invention.

Referring now to FIGS. 3 and 4, a deposition system 1' is illustrated for depositing a thin film, such as a barrier film, on a substrate using plasma enhanced atomic layer deposition (PEALD) according to another embodiment of the present invention. The deposition system 1' includes many of the same features as deposition system 1 illustrated in FIGS. 1 and 2, which like reference numerals represent like components. Deposition system 1' further includes a shield 24 configured to surround a peripheral edge of process space 85 in FIG. 3, or process space 85' in FIG. 4. Substrate stage 20 may further include an outer lip 22 configured to couple with shield 24 when substrate stage 20 is translated upwards to form process space 85'. For example, outer lip 22 can be configured to seal with shield 24. Shield 24 can be configured to permit passage of process gases there through (as in a perforated shield) in order to permit evacuation of process space 85'. If shield 24 is not configured to permit evacuation of process space 85', then a separate vacuum pumping system 35 similar to vacuum pumping system 34 can be used to evacuate the process space 85'.

The shield 24 depicted in FIGS. 3 and 4 can serve multiple purposes. The shield 24 can provide a simplified cylindrical geometry in which gas fluid flow in the process spaces 85 and 85' can be more reliably predicted or controlled. By having openings at predetermined positions of the shield (i.e., as in a perforated shield) the fluid flow can be engineered. Likewise, the shield 24 can provide a symmetrical path to electrical ground proximate the plasma edge, which can provide a uniform plasma that can be more reliably predicted or controlled. Furthermore, the shield 24 can be a replaceable unit, collecting deposits that would normally accumulate on the interior of walls 10. As such, shield 24 can be replaced in normal routine maintenance and extend the time period before the interior of walls 10 needs to be cleaned.

Figure 5:
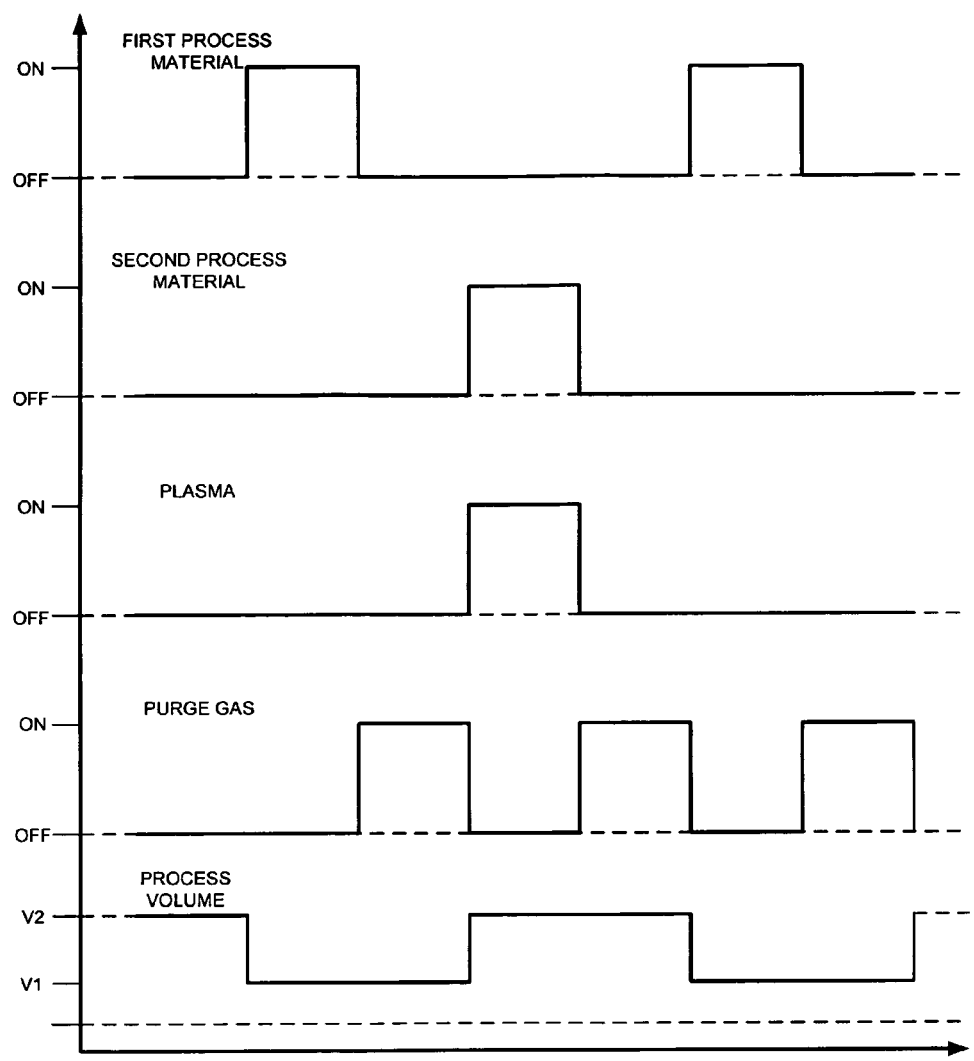
FIG. 5 depicts a schematic timing diagram according to one embodiment of the present invention to be used in the deposition systems of FIGS. 1-4.

Referring now to FIG. 5, deposition system 1, or 1' can be configured to perform a plasma enhanced atomic layer deposition (PEALD) process, wherein a film precursor and a reduction gas are sequentially and alternatingly introduced to form a thin film on a substrate. For example, in a PEALD process for preparing a tantalum-containing film, the film precursor can include a metal halide (e.g., tantalum pentachloride) or a metal organic (e.g., $Ta(NC(CH_3)_2C_2H_5)(N(CH_3)_2)_3$; hereinafter referred to as TAIMATA®; for additional details, see U.S. Pat. No. 6,593,484). In this example, the reduction gas can include hydrogen or ammonia ($NH_3$), $N_2$ and $H_2$, $N_2H_4$, $NH(CH_3)_2$, or $N_2H_3CH_3$.

The film precursor is introduced to processing chamber 10 for a first period of time in order to cause adsorption of the film precursor on exposed surfaces of substrate 25. Preferably, a monolayer absorption of material occurs. Thereafter, as shown in FIG. 5, the processing chamber 10 is purged with a purge gas for a second period of time. After adsorbing film precursor on substrate 25, a reduction gas is introduced to processing chamber 10 for a third period of time, while power is coupled through, for example, the upper assembly 30 from the first power source 50 to the reduction gas. The coupling of power to the reduction gas heats the reduction gas, thus causing ionization and dissociation of the reducing gas in order to form, for example, dissociated species such as atomic hydrogen which can react with the absorbed Ta film precursor to reduce the absorbed Ta film precursor to form the desired Ta containing film.

In one example, during the first process described in FIG. 5, tantalum (Ta), tantalum nitride, or tantalum carbonitride can be deposited using a PEALD process, in which a Ta precursor such as $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$, followed by a exposure to a reduction gas such as $H_2$, $NH_3$, $N_2$ and $H_2$, $N_2H_4$, $NH(CH_3)_2$, or $N_2H_3CH_3$. In the PEALD process of the present invention, the reduction gas is plasma activated.

In another example of the PEALD process of the present invention, when depositing titanium (Ti), titanium nitride, or titanium carbonitride, the film precursor can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT), and the reduction gas can include $H_2$, $NH_3$, $N_2$ and $H_2$, $N_2H_4$, $NH(CH_3)_2$, or $N_2H_3CH_3$.

As another example of the PEALD process, when depositing tungsten (W), tungsten nitride, or tungsten carbonitride, the film precursor can include $WF_6$, or $W(CO)_6$, and the reduction gas can include $H_2$, $NH_3$, $N_2$ and $H_2$, $N_2H_4$, $NH(CH_3)_2$, or $N_2H_3CH_3$.

In another example of the PEALD process of the present invention, when depositing molybdenum (Mo), the film precursor can include molybdenum hexafluoride ($MoF_6$), and the redcution gas can include $H_2$.

When depositing copper in the ALD process, the film precursor can include organometallic compounds, such as Cu(T-MVS)(hfac), also known by the trade name CupraSelect®, available from Schumacher, a unit of Air Products and Chemicals, Inc., 1969 Palomar Oaks Way, Carlsbad, Calif. 92009), or inorganic compounds, such as CuCl. The reduction gas can include at least one of $H_2$, $O_2$, $N_2$, $NH_3$, or $H_2O$. As used herein, the term "at least one of A, B, C, . . . or X" refers to any one of the listed elements or any combination of more than one of the listed elements.

In another example of the PEALD process of the present invention, when depositing $ZrO_2$, the film precursor can include $Zr(NO_3)_4$, or $ZrCl_4$, and the reduction gas can include $H_2O$.

When depositing hafnium oxide the PEALD process of the present invention, the film precursor can include $Hf(OBu^t)_4$, $Hf(NO_3)_4$, or $HfCl_4$, and the reduction gas can include $H_2O$. In another example, when depositing hafnium (Hf), the film precursor can include $HfCl_4$, and the reduction gas can include $H_2$.

In still another example of the PEALD process of the present invention, when depositing niobium (Nb), the film precursor can include niobium pentachloride ($NbCl_5$), and the reduction gas can include $H_2$.

In another example of the PEALD process of the present invention, when depositing zinc (Zn), the film precursor can include zinc dichloride ($ZnCl_2$), and the reduction gas can include $H_2$.

In another example of the PEALD process of the present invention, when depositing silicon oxide, the film precursor can include $Si(OC_2H_5)_4$, $SiH_2Cl_2$, $SiCl_4$, or $Si(NO_3)_4$, and the reduction gas can include $H_2O$ or $O_2$. In another example, when depositing silicon nitride, the film precursor can include $SiCl_4$, or $SiH_2Cl_2$, and the reduction gas can include $NH_3$, or $N_2$ and $H_2$. In another example, when depositing TiN, the film precursor can include titanium nitrate ($Ti(NO_3)$), and the reduction gas can include $NH_3$.

In another example of the ALD process, when depositing aluminum, the film precursor can include aluminum chloride ($Al_2Cl_6$), or trimethylaluminum ($Al(CH_3)_3$), and the reduction gas can include $H_2$. When depositing aluminum nitride, the film precursor can include aluminum trichloride, or trimethylaluminum, and the reduction gas can include $NH_3$, or $N_2$ and $H_2$. In another example, when depositing aluminum oxide, the film precursor can include aluminum chloride, or trimethylaluminum, and the reduction gas can include $H_2O$, or $O_2$ and $H_2$.

In another example of the PEALD process of the present invention, when depositing GaN, the film precursor can include gallium nitrate ($Ga(NO_3)_3$), or trimethylgallium ($Ga(CH_3)_3$), and the reduction gas material can include $NH_3$.

Furthermore, in the above PEALD processes, the process volume can be varied between a first volume (V1) during introduction of the first process gas material for the first time period and optionally the introduction of the purge gas for the second time period, and a second volume (V2) during the introduction of the second process gas material for the third period of time and optionally the introduction of the purge gas for the fourth period of time. An optimal volume (V1, V2) can be selected for the process space for each process step in the PEALD process.

For example, the first volume (V1) can be sufficiently small such that the first process gas material passes through the process space and some fraction of the first process gas material adsorbs on the surface of the substrate. As the first volume of the process space is reduced, the amount of the first process gas material necessary for adsorption on the substrate surface is reduced and the time required to exchange the first process gas material within the first process space is reduced. For instance, as the first volume of the process space is reduced, the residence time is reduced, hence, permitting a reduction in the first period of time.

Moreover, for example, the second volume (V2) can be set to a volume in which the formation of plasma from the second process material leads to the formation of uniform plasma above the substrate.

When processing substrates including semiconductor wafers, the process space is substantially cylindrical, characterized by a diameter (D) and a height or spacing (h) between the substrate and the upper assembly. The diameter is related to the size of the substrate, whereas the spacing (or height) can be the variable parameter for adjusting the volume of the process space. For uniform plasma, the aspect ratio between the substrate (or volume) diameter and the spacing (i.e., D/h) can be less than or equal to approximately a value of ten (10), and desirably less than approximately a value of 5. For example, as the aspect ratio increases, the plasma uniformity has been observed to worsen, while as the aspect ratio decreases, the plasma uniformity has been observed to improve. For instance, when depositing a film on a 200 mm substrate using plasma, the spacing h should be approximately 20 mm or greater.

For example, the first volume during introduction of the first process material can, for example, include a spacing (from the substrate stage 20 to the upper assembly 30) less than or equal to 20 mm for a 200 mm substrate (or less than or equal to 30 mm for a 300 mm substrate), and the second volume during introduction of the second process material can, for example, include a spacing greater than 20 mm for a 200 mm substrate (or greater than or equal to 30 mm for a 300 mm substrate).

Figure 6:
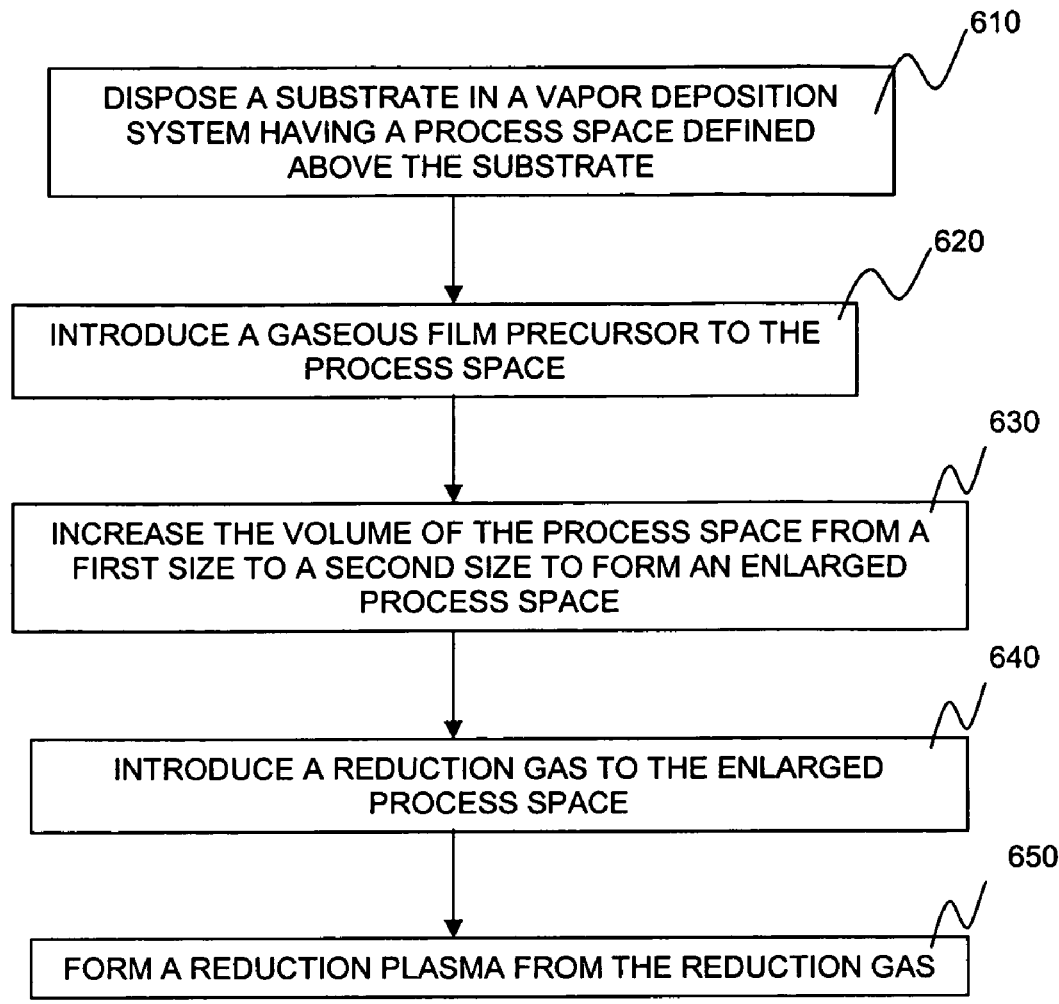
FIG. 6 shows a process flow diagram of a process in accordance with one embodiment of the present invention.

FIG. 6 shows a process flow diagram of a process in accordance with one embodiment of the present invention. The process of FIG. 6 may be performed by the processing system of FIGS. 1-4, or any other suitable processing system. As seen in FIG. 6, in step 610, the process begins when a substrate is disposed in a vapor deposition system having a process space defined above the substrate. In step 620, a gaseous film precursor is introduced to the process space. In step 630, the volume of the process space is increased from a first size to a second size to form an enlarged process space. In step 640, a reduction gas is introduced into the enlarged process space. In step 650, a reduction plasma is formed from the reduction gas.

Furthermore, in one embodiment of the present invention, the steps above can be reversed and repeated as the process continues. For instance, the reduction plasma can be extinguished, the volume of the process space can be reduced from the second size to the first size, and the steps 610-640 can be repeated.

In step 650, the plasma can be formed by applying RF energy at a frequency from 0.1 to 100 MHz. In one aspect of the present invention, prior to forming the plasma, the volume of the process space is increased in order to facilitate conditions more conducive for plasma uniformity. As such, in step 630, the substrate stage can be translated to a position that improves plasma uniformity of the second vapor deposition process. For example, the substrate stage can be set to a position in which the plasma uniformity is better than 2% across a 200 mm diameter of the substrate stage or better than 1% across a 200 mm diameter of the substrate stage. For example, the substrate stage can be set to a position in which the plasma uniformity is better than 2% across a 300 mm diameter of the substrate stage or better than 1% across a 300 mm diameter of the substrate stage.

In step 650, the reduction plasma can have a power density less than 10 $W/cm^2$ and preferably less than 1 $W/cm^2$. The duration of the reduction plasma can be less than 20 s and preferably less than 5 s. For example, referring to FIGS. 1 through 4, the reduction plasma may be formed by coupling 200 W to 3000 W of radio frequency (RF) power to the reduction gas through the upper assembly 30.

In step 620, the gaseous film precursor is introduced in a region above the substrate surrounded by a shield. In one embodiment of the present invention, the shield can be perforated permitting evacuation of the gaseous film precursor by pumping the gaseous film precursor through the perforated shield. If the shield does not have perforations, the interior of the process space can be pumped separately.

In steps 610-640, a film can be deposited of least one of a metal, a metal oxide, a metal nitride, a metal silicide, or a metal carbonitride. For example, the film can include at least one of a tantalum film, a tantalum nitride film, or a tantalum carbonitride film. In steps 610-640, a film can be deposited of at least one of an Al film, a Cu film, a Zn film, a metal silicide film, or a germanium-including film, or a combination of any one of these films deposited separately or as an alloy. In steps 610-640, a film can be deposited of a zirconium oxide film, a hafnium oxide, a silicon oxide film, a silicon nitride, a titanium nitride, or a GaN film, or a combination of any one of these films.

During step 650, a substrate bias can be provided to the substrate. For example, the substrate bias can be a DC voltage and/or a RF voltage having a frequency from 0.1 to 100 MHz. Prior to step 660, electromagnetic power can be coupled to the vapor deposition system to generate a plasma that accelerates a reduction reaction process at a surface of the first film.

Furthermore, a purge gas can be introduced after introducing the film precursor. Moreover, with or without the purge gas present, electromagnetic power can be coupled to the vapor deposition system to release contaminants from at least one of the vapor deposition system or the substrate. The electromagnetic power can be coupled into the vapor deposition system in the form of a plasma, an ultraviolet light, or a laser.

As shown in FIGS. 1-4, deposition systems 1 and 1' include a controller 70 that can be coupled to processing chamber 10, substrate stage 20, upper assembly 30, first process material supply system 40, second process material supply system 42, purge gas supply system 44, first power source 50, substrate temperature control system 60, and/or process volume adjustment system 80.

The controller 70 can include a microprocessor, memory, and a digital I/O port capable of generating control voltages sufficient to communicate and activate inputs to deposition system 1 (1') as well as monitor outputs from deposition system 1 (1') in order to control and monitor the above-discussed processes for film deposition. For example, the controller 70 can include computer readable medium containing program instructions for execution to accomplish the steps described above in relation to FIG. 6. Moreover, the controller 70 may be coupled to and may exchange information with the process chamber 10, substrate stage 20, upper assembly 30, first process material gas supply system 40, second process material supply gas system 42, purge gas supply system 44, first power source 50, second power source 52, substrate temperature controller 60, and/or pressure control system 32. For example, a program stored in the memory may be utilized to activate the inputs to the aforementioned components of the deposition system 1 (1') according to a process recipe in order to perform one of the above-described non-plasma or plasma enhanced deposition processes.

One example of the controller 70 is a DELL PRECISION WORKSTATION 610™, available from Dell Corporation, Austin, Tex. However, the controller 70 may be implemented as a general-purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the deposition system 1 (1'), or it may be remotely located relative to the deposition system 1 (1'). For example, the controller 70 may exchange data with the deposition system 1 (1') using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 (1') via a wireless connection.

Although only certain exemplary embodiments of inventions have been described in detail above, those skilled in the art will readily appreciate that many modifications are possible in the exemplary embodiments without materially departing from the novel teachings and advantages of this invention.

The invention claimed is:

1. A method for forming a thin film on a substrate in a vapor deposition system, comprising:
   disposing a substrate in said vapor deposition system having a process space defined above the substrate;
   introducing a gaseous film precursor to said process space;
   increasing the volume of said process space from a first size to a second size to form an enlarged process space having a separation distance between the substrate and an upper assembly of the vapor deposition system between 2 and 6 cm, following said introduction of said film precursor to said process space;
   introducing a reduction gas to the enlarged process space; and
   forming a reduction plasma from said reduction gas.

2. The method of claim 1, further comprising:
   extinguishing said reduction plasma;
   reducing the volume of said process space from said second size to said first size; and
   repeating said introducing said film precursor, said increasing the volume of said process space, said introducing said reduction gas, and said forming said reduction plasma.

3. The method of claim 1, wherein said increasing the volume of said process space comprises:
   translating a substrate stage to a position that improves plasma uniformity of the reduction plasma.

4. The method of claim 3, wherein said translating comprises:
   setting the substrate stage to a position in which the plasma uniformity is better than 2% across a diameter of the substrate.

5. The method of claim 4, wherein said translating comprises:
   setting the substrate stage to a position in which the plasma uniformity is better than 1% across a diameter of the substrate.

6. The method of claim 1, wherein the introducing a gaseous film precursor, introducing a reduction gas, and forming a reduction plasma comprise:
   depositing at least one of a tantalum film, a tantalum nitride film, or a tantalum carbonitride film.

7. The method of claim 1, wherein the introducing a gaseous film precursor, introducing a reduction gas, and forming a reduction plasma comprise:
   depositing at least one of a metal film, a metal oxide film, a metal nitride film, a metal silicide film, or a metal carbonitride film, or a combination of any one of these films separately.

8. The method of claim 1, wherein the introducing a gaseous film precursor, introducing a reduction gas, and forming a reduction plasma comprise:
   depositing at least one of a Cu film, an Al film, a zirconium oxide film, a hafnium oxide film, a silicon oxide film, a silicon nitride film, a titanium nitride film, or a GaN film, or a combination of any one of these films.

9. The method of claim 1, wherein the introducing a gaseous film precursor comprises:
introducing the gaseous film precursor in a region above the substrate surrounded by a shield.

10. The method of claim 1, wherein the forming a reduction plasma comprises:
applying RF energy at a frequency from 0.1 to 100 MHz.

11. The method of claim 10, wherein the forming a reduction plasma comprises:
generating a reduction plasma having a power density less than 10 W/cm$^2$.

12. The method of claim 10, wherein the forming a reduction plasma comprises:
generating a reduction plasma having a power density less than 1 W/cm$^2$.

13. The method of claim 10, further comprising:
sustaining said reduction plasma for a period less than 20 s.

14. The method of claim 9, further comprising:
evacuating the film precursor from the region above the substrate by pumping the gaseous film precursor through holes in the shield.

15. The method of claim 10, further comprising:
sustaining said reduction plasma for a period less than 5 s.

16. The method of claim 1, further comprising:
introducing a purge gas after said introducing a gaseous film precursor.

17. The method of claim 1, further comprising:
providing a substrate bias to the substrate at least during the reduction plasma.

18. The method of claim 17, wherein the providing a substrate bias comprises:
biasing the substrate with at least one of a DC voltage or a RF voltage having a frequency from 0.1 to 100 MHz.

19. The method of claim 1, wherein said increasing sets the volume of the second size such that an aspect ratio of D/h, where D is a diameter of the substrate and h is a height of the second volume is in a range between 5 and 10.

20. The method of claim 1, wherein said increasing the volume of said process space comprises translating the substrate within a region having a shield surrounding a peripheral edge of the process space and including perforations for exhausting the process space.

21. The method of claim 20, further comprising:
exhausting the process space through the perforations.

22. The method of claim 20, further comprising:
extinguishing said reduction plasma; and
reducing the volume of said process space from said second size to said first size by translating a substrate stage holding the sample to a position where the substrate stage seals to the shield.

* * * * *